United States Patent
Yasumoto et al.

(10) Patent No.: US 10,156,295 B2
(45) Date of Patent: Dec. 18, 2018

(54) PIEZOELECTRIC LINEAR ACTUATOR, PIEZOELECTRICALLY DRIVEN VALVE, AND FLOW RATE CONTROL DEVICE

(71) Applicant: FUJIKIN INCORPORATED, Osaka (JP)

(72) Inventors: Naofumi Yasumoto, Osaka (JP); Ryousuke Dohi, Osaka (JP); Kouji Nishino, Osaka (JP); Nobukazu Ikeda, Osaka (JP); Kohei Shigyou, Osaka (JP)

(73) Assignee: Fujikin Incorporated, Osaka (JP)

( * ) Notice: Subject to any disclaimer, the term of this patent is extended or adjusted under 35 U.S.C. 154(b) by 85 days.

(21) Appl. No.: 15/121,240

(22) PCT Filed: Feb. 10, 2015

(86) PCT No.: PCT/JP2015/000602
§ 371 (c)(1),
(2) Date: Aug. 24, 2016

(87) PCT Pub. No.: WO2015/125438
PCT Pub. Date: Aug. 27, 2015

(65) Prior Publication Data
US 2016/0363231 A1  Dec. 15, 2016

(30) Foreign Application Priority Data
Feb. 24, 2014  (JP) .................. 2014-032501

(51) Int. Cl.
| | | |
|---|---|---|
| F16K 7/16 | (2006.01) |
| F16K 31/00 | (2006.01) |
| H01L 41/25 | (2013.01) |
| H01L 41/23 | (2013.01) |
| F16K 27/04 | (2006.01) |
| F16K 7/14 | (2006.01) |
| H01L 41/053 | (2006.01) |
| H01L 41/083 | (2006.01) |
| G05D 7/06 | (2006.01) |

(52) U.S. Cl.
CPC .............. *F16K 31/004* (2013.01); *F16K 7/14* (2013.01); *F16K 7/16* (2013.01); *F16K 27/041* (2013.01);
(Continued)

(58) Field of Classification Search
CPC ... H01L 41/041; H01L 41/048; H01L 41/053; H01L 41/23; H01L 41/25; F16K 31/007; F16K 31/008; Y10T 137/7761
See application file for complete search history.

(56) References Cited

U.S. PATENT DOCUMENTS 3,995,813 A * 12/1976 Bart ...................... F02M 47/043
239/584
4,022,166 A * 5/1977 Bart ...................... F02M 47/02
123/472
(Continued)

FOREIGN PATENT DOCUMENTS

JP  8-338546 A  12/1996
JP  2003-120832 A  4/2003
(Continued)

OTHER PUBLICATIONS

International Search Report issued in corresponding application PCT/JP2015/000602, completed Apr. 30, 2015 and dated May 19, 2015, citing only category A references.

*Primary Examiner* — Matthew W Jellett
(74) *Attorney, Agent, or Firm* — Griffin and Szipl PC (57) ABSTRACT

A piezoelectric linear actuator includes a laminated piezoelectric actuator, a lower support member that supports the laminated piezoelectric actuator, a pressing member that biases the laminated piezoelectric actuator from the top thereof, a guide member connected to the lower support
(Continued)

member to guide the pressing member; and a displacement transmission member which includes a pair of displacement transmission plates, an adjustment screw connected to the pair of displacement transmission plates, an output section connected to the pair of displacement transmission plates, and an elastic body that biases the output section downward.

22 Claims, 8 Drawing Sheets

(52) U.S. Cl.
CPC .......... *F16K 27/048* (2013.01); *F16K 31/007* (2013.01); *F16K 31/008* (2013.01); *G05D 7/0635* (2013.01); *H01L 41/053* (2013.01); *H01L 41/083* (2013.01); *H01L 41/23* (2013.01); *H01L 41/25* (2013.01); *Y10T 137/7761* (2015.04)

(56) References Cited

U.S. PATENT DOCUMENTS

| | | | |
|---|---|---|---|
| 5,669,408 A * | 9/1997 | Nishino | G05D 7/0635 137/486 |
| 7,267,111 B2 * | 9/2007 | Liskow | F02M 51/005 123/498 |
| 8,181,932 B2 * | 5/2012 | Matsumoto | F16K 7/14 251/129.02 |
| 8,191,856 B2 * | 6/2012 | Matsumoto | F16K 7/14 251/129.02 |
| 8,729,774 B2 * | 5/2014 | Moler | H01L 41/053 310/328 |
| 2011/0315905 A1 | 12/2011 | Hirose et al. | |

FOREIGN PATENT DOCUMENTS

| | | |
|---|---|---|
| JP | 2010-151698 A | 7/2010 |
| WO | 2010/073473 A1 | 7/2010 |

\* cited by examiner

PIEZOELECTRIC LINEAR ACTUATOR, PIEZOELECTRICALLY DRIVEN VALVE, AND FLOW RATE CONTROL DEVICE

This is a National Phase Application in the United States of International Patent Application No. PCT/JP2015/000602 filed Feb. 10, 2015, which claims priority on Japanese Patent Application No. 2014-032501, filed Feb. 24, 2014. The entire disclosures of the above patent applications are hereby incorporated by reference.

TECHNICAL FIELD

The present invention relates to a piezoelectric linear actuator using a laminated piezoelectric actuator, a piezoelectrically driven valve comprising the linear actuator, and a flow rate control device comprising the piezoelectrically driven valve.

BACKGROUND ART

Conventionally, a laminated piezoelectric actuator which is formed by laminating a piezoelectric element has been commonly used in the drive units of linear actuators and valves. A flow control device for controlling flow rate with a piezoelectric driving valve using a laminated piezoelectric actuator is also known.

Figure 10:
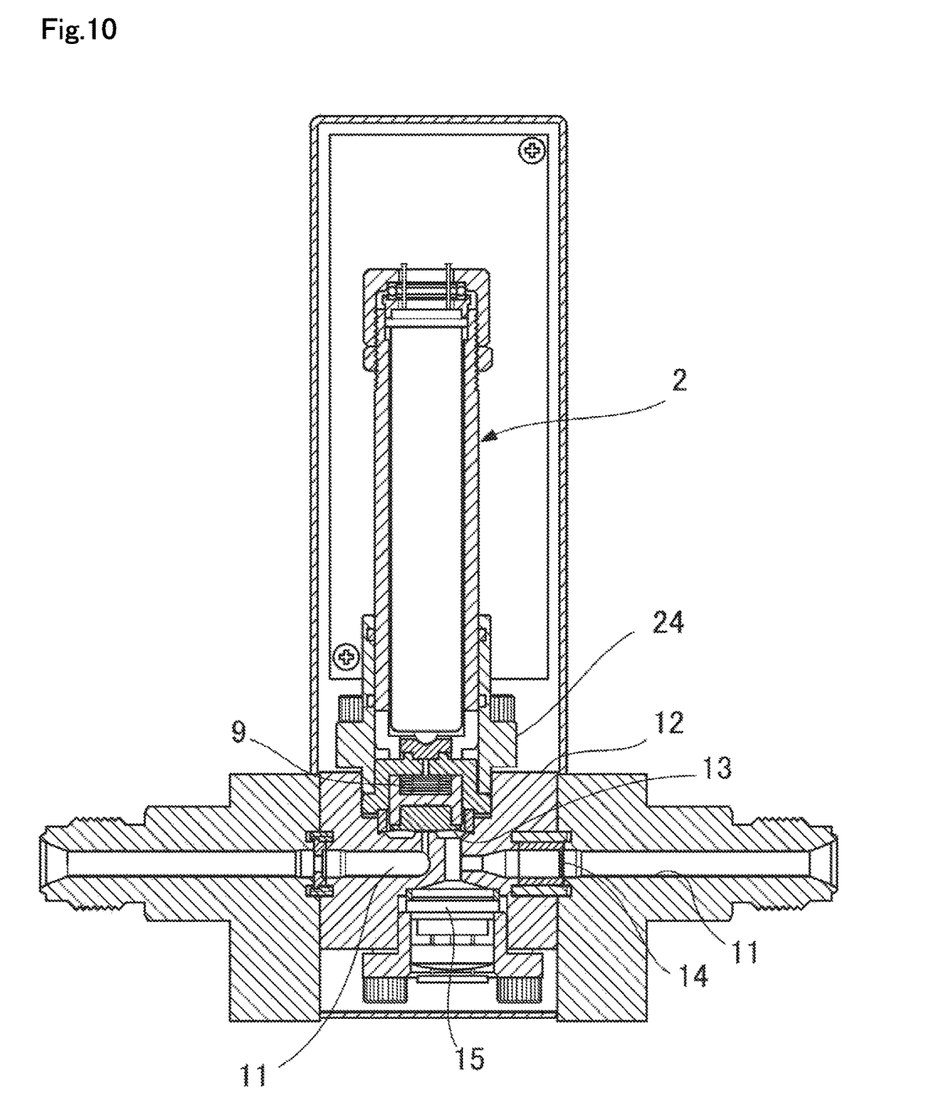
FIG. 10 is a longitudinal front view of a conventional pressure type flow rate control device.

The flow control device shown in FIG. 10 presents an example of this type of flow control device. It opens and closes the valve element 13, which is made with, for example, a metal diaphragm, interposed with flow passage 11 inside the valve block 12 by using the laminated piezoelectric actuator 2 attached to the valve block 12. (Patent document 1-3)

The flow control device shown in FIG. 10 is referred to as a pressure type flow control device. When the so-called critical expansion condition $(P_1/P_2) >= $ approx. 2 is maintained between the downstream pressure $P_2$ of the orifice 14 interposed by the flow passage 11 and upstream pressure $P_1$, the relationship of gas flow rate Q flowing through the orifice 14 becomes $Q=KP_1$ (where K is a constant).

Applying this relationship, the flow rate Q can be controlled with high accuracy by controlling the pressure $P_1$ detected by the pressure detector 15. Moreover, the flow rate hardly fluctuates even when the upstream gas pressure of valve 13 changes dramatically. High precision in the pressure $P_1$ is achieved by the high response of the laminated piezoelectric actuator 2.

CITATION LIST

Patent Literature

Patent Literature 1: JP-A-2003-120832
Patent Literature 2: JP-A-8-338546
Patent Literature 3: JP-A-2010-151698

SUMMARY OF INVENTION

Technical Problem

Recently, especially in the field of semiconductor production, gas providing systems have to be minimized so the minimization of valves and flow control devices applied in such gas providing systems is also required.

However, stem fixing guide 24 (FIG. 10, Patent document 1) and piezoelectric element sustention parts (Patent document 2) are arranged to surround the laminated piezoelectric actuator and that has prevented the minimization of such devices.

The purpose of this invention is to minimize a piezoelectrically driven valve equipped with a piezoelectric linear actuator and providing a flow control device equipped with the piezoelectrically driven valve by making the piezoelectric linear actuator using a laminated piezoelectric actuator thinner.

Solution to Problem

To achieve the above purposes, the first aspect of the piezoelectric linear actuator according to the present invention comprises a laminated piezoelectric actuator, a lower support member that holds and extends rightward and leftward of the aforementioned laminated piezoelectric actuator, a pressing member that biases the aforementioned laminated piezoelectric actuator from the top thereof and extends rightward and leftward of the laminated piezoelectric actuator, a guide member that is connected to the lower support member at both right and left sides of the aforementioned laminated piezoelectric actuator and guides right and left sides of the aforementioned pressing member, and a displacement transmission member which transfer a displacement of the aforementioned laminated piezoelectric actuator resulting from a piezoelectric effect, the displacement transmission member comprising a pair of displacement transmission plates that extend along the right and left sides of the aforementioned laminated piezoelectric actuator and is capable of moving vertically to intersect the aforementioned lower support member and the aforementioned pressing member and connects at the each of the bottom of the aforementioned lower support members and the upper part of the aforementioned pressing member, an adjustment screw that is connected to the aforementioned pair of the displacement transmission plates and is capable of adjusting a relative height of the aforementioned displacement transmission plates against the aforementioned pressing member, an output section that is connected with the aforementioned pair of displacement transmission plates at the bottom part of the aforementioned lower support member, and an elastic body that biases the output section downward.

The second aspect of the piezoelectric linear actuator according to the present invention is that a pressing member biases the aforementioned laminated piezoelectric actuator by the elastic body between the aforementioned guide member and the aforementioned pressing member according to the first aspect.

The third aspect of the piezoelectric linear actuator according to the present invention is that the aforementioned guide member is provided with a guide shaft that slidably penetrates the right or left side of the aforementioned pressing member according to the first aspect.

The fourth aspect of the piezoelectric linear actuator according to the present invention is that the aforementioned guide member is provided with a guide shaft that slidably penetrates the right or left side of the aforementioned pressing member supported by the aforementioned lower support member according to the first aspect.

The fifth aspect of the piezoelectric linear actuator according to the present invention is that, according to the third and fourth aspects, said actuator is provided with a coil spring that is fitted around the guide shaft and biases the aforementioned pressing member to the side of the aforementioned laminated piezoelectric actuator.

The sixth aspect of the piezoelectric linear actuator according to the present invention is that, according to the aforementioned first aspect, the aforementioned lower support member, the aforementioned pressing member, the aforementioned guide member and the aforementioned displacement transmission member fit within a width of the aforementioned laminated piezoelectric actuator.

The first aspect of a piezoelectrically driven valve according to the present invention comprises a piezoelectric linear actuator comprised of a laminated piezoelectric actuator, a lower support member that supports the aforementioned laminated piezoelectric actuator and extends rightward and leftward of the laminated piezoelectric actuator, a pressing member that biases the aforementioned laminated piezoelectric actuator from the top thereof and extends rightward and leftward of the laminated piezoelectric actuator, a guide member that is connected to the aforementioned lower supports member at the both sides of the aforementioned laminated piezoelectric actuator and guides the both sides of the aforementioned pressing member, a pair of displacement transmission members that transfer a displacement resulting from a piezoelectric effect of the aforementioned laminated piezoelectric actuator and extend along the right and left sides of the aforementioned laminated piezoelectric actuator and is capable of moving vertically to intersect the aforementioned lower support member and the aforementioned pressing member and that are connected at the each of the bottom of the aforementioned lower support member and the upper part of the aforementioned pressing member, an adjustment screw that is connected to the aforementioned pair of displacement transmission plates and is capable of adjusting a relative height of the aforementioned displacement transmission plates against the aforementioned pressing member, and an output section that is connected with the aforementioned pair of displacement transmission plates at a bottom part of the aforementioned lower support member and an elastic body that biases the output section downward, and an aforementioned displacement transmission member comprised thereof; and comprised of a valve block to which the aforementioned piezoelectric linear actuator is attached and wherein a flow path is formed, a valve shaft formed in the aforementioned valve block and at the output section of the aforementioned piezoelectric linear actuator, and a valve body that opens and closes the aforementioned flow path by operating the valve shaft.

The second aspect of a piezoelectrically driven valve according to the present invention is that, according to the aforementioned first aspect of the piezoelectrically driven valve, the aforementioned pressing member biases the aforementioned laminated piezoelectric actuator by the elastic body interposed between the aforementioned guide member and the aforementioned pressing member.

The third aspect of a piezoelectrically driven valve according to the present invention is that, according to the aforementioned first aspect of the piezoelectrically driven valve, the aforementioned guide member has a guide shaft that slidably penetrates the right or left side of the aforementioned pressing member.

The forth aspect of the piezoelectrically driven valve according to the present invention is that, according to the first aspect of the aforementioned piezoelectrically driven valve, the aforementioned guide member is comprised of a guide shaft that slidably penetrates the right or left side of the aforementioned pressing member supported by the aforementioned lower support member.

The fifth aspect of a piezoelectrically driven valve according to the present invention is that, according to the third or fourth aspects of the aforementioned piezoelectrically driven valve, said valve comprised of a coil spring that is fitted around the guide shaft and biases the aforementioned pressing member toward the aforementioned laminated piezoelectric actuator.

The sixth aspect of a piezoelectrically driven valve according to the present invention is that, according to the first aspect of the aforementioned piezoelectrically driven valve, the aforementioned lower support member, the aforementioned pressing member, the aforementioned guide member and aforementioned displacement transmission member, and the aforementioned valve block are within the range of a width of the aforementioned laminated piezoelectric actuator.

The seventh aspect of a piezoelectrically driven valve according to the present invention, according to the first aspect of the aforementioned piezoelectrically driven valve, is that the aforementioned valve body is a metal diaphragm valve body.

The first aspect of a flow rate control device according to the present invention comprises a laminated piezoelectric actuator, a lower support member that supports the aforementioned laminated piezoelectric actuator and extends rightward and leftward of the laminated piezoelectric actuator, a pressing member that biases the aforementioned laminated piezoelectric actuator from the top thereof and extends rightward and leftward of the laminated piezoelectric actuator, a guide member that is connected to the aforementioned lower support member at both right and left sides of the aforementioned laminated piezoelectric actuator and guides the both right and left sides of the aforementioned pressing member, a pair of displacement transmission members that transfers a displacement resulting from a piezoelectric effect of the aforementioned laminated piezoelectric actuator and extend along the right and left sides of the aforementioned laminated piezoelectric actuator and is capable of moving vertically to intersect the aforementioned lower support membrane and the aforementioned pressing member and is connected respectively at the lower part of the aforementioned lower support member and the upper part of the aforementioned pressing member, an adjustment screw that is connected to the aforementioned pair of displacement transmission plates and is capable of adjusting a relative height of the aforementioned pair of displacement transmission plates with respect to the aforementioned pressing member, an output section that is connected with the aforementioned pair of displacement transmission plates at a lower part of the aforementioned lower support member, and an elastic body that biases the output section downward, the aforementioned displacement member comprised thereof, and the piezoelectric linear actuator comprised of said lower support member, said pressing member, said guide member, said pair of displacement transmission members, said adjustment screw, said output section and said elastic body, a valve block to which is attached the aforementioned piezoelectric linear actuator and in which a flow stream is created, a valve shaft that is created inside the aforementioned valve block and at the output section of the aforementioned piezoelectric linear actuator and valve member that opens and closes by operating the valve shaft, and the piezoelectrically driven valve comprised said piezoelectric linear actuator, said valve block, said valve shaft, said valve body, and said piezoectrically driven valve, and a control device that controls the opening and closing of the aforementioned piezoelectrically driven valve.

The second aspect of the flow control device according to the present invention is that, according to the said first aspect of the flow control device, said flow control device includes a pressing member that biases the aforementioned laminated piezoelectric actuator by the elastic body interposed between the aforementioned guide member and the aforementioned pressing member.

The third aspect of the flow control device according to the present invention is that, according to the first aspect of the said flow control device, aforementioned guide member is provided with a guide shaft that slidably penetrates the right or left side of the aforementioned pressing member.

The fourth aspect of the flow control device according to the present invention is that, according to the first aspect of the said flow control device, the aforementioned guide member is provided with a guide shaft that slidably penetrates the right or left side of the aforementioned pressing member supported by the aforementioned lower support member.

The fifth aspect of the flow control device of according to the present invention is that, according to the said third or fourth aspect of the flow control device, said flow control device is provided with a coil spring that is fitted around the guide shaft and biases the aforementioned pressing member toward the aforementioned laminated piezoelectric actuator.

The sixth aspect of the flow control device according to the present invention is that, according to the said first aspect of the said flow control device, the aforementioned lower support member, the aforementioned pressing member, the aforementioned guide member, the aforementioned displacement transmission member, and the aforementioned valve block are within the range of a width of the aforementioned laminated piezoelectric actuator.

The seventh aspect of the flow control device according to the present invention is that, according to the said first aspect of the flow control device, the flow control device is provided with an orifice interposed inside a flow path of a downstream side of the aforementioned valve member and a pressure detector for detecting the pressure inside a flow path of an upstream side of the said orifice. The aforementioned control device controls opening and closing of the aforementioned piezoelectric driven valve based on a detected value given by the said pressure detector.

Advantageous Effects of Invention

According to the present invention, by adopting the said configuration, it is possible to reduce the thickness of a piezoelectrically driven valve and a flow control device using the laminated piezoelectric actuator by aggregating the configuration members on the right and left of the laminated piezoelectric actuator enabling the achievement of a maximally thin piezoelectric linear actuator, even in the width thereof for instance.

DESCRIPTION OF EMBODIMENTS

Embodiments of the invention are described below with reference to FIGS. 1-9. The same or similar components are denoted with the same reference numbers throughout all the drawings and examples.

Figure 1:
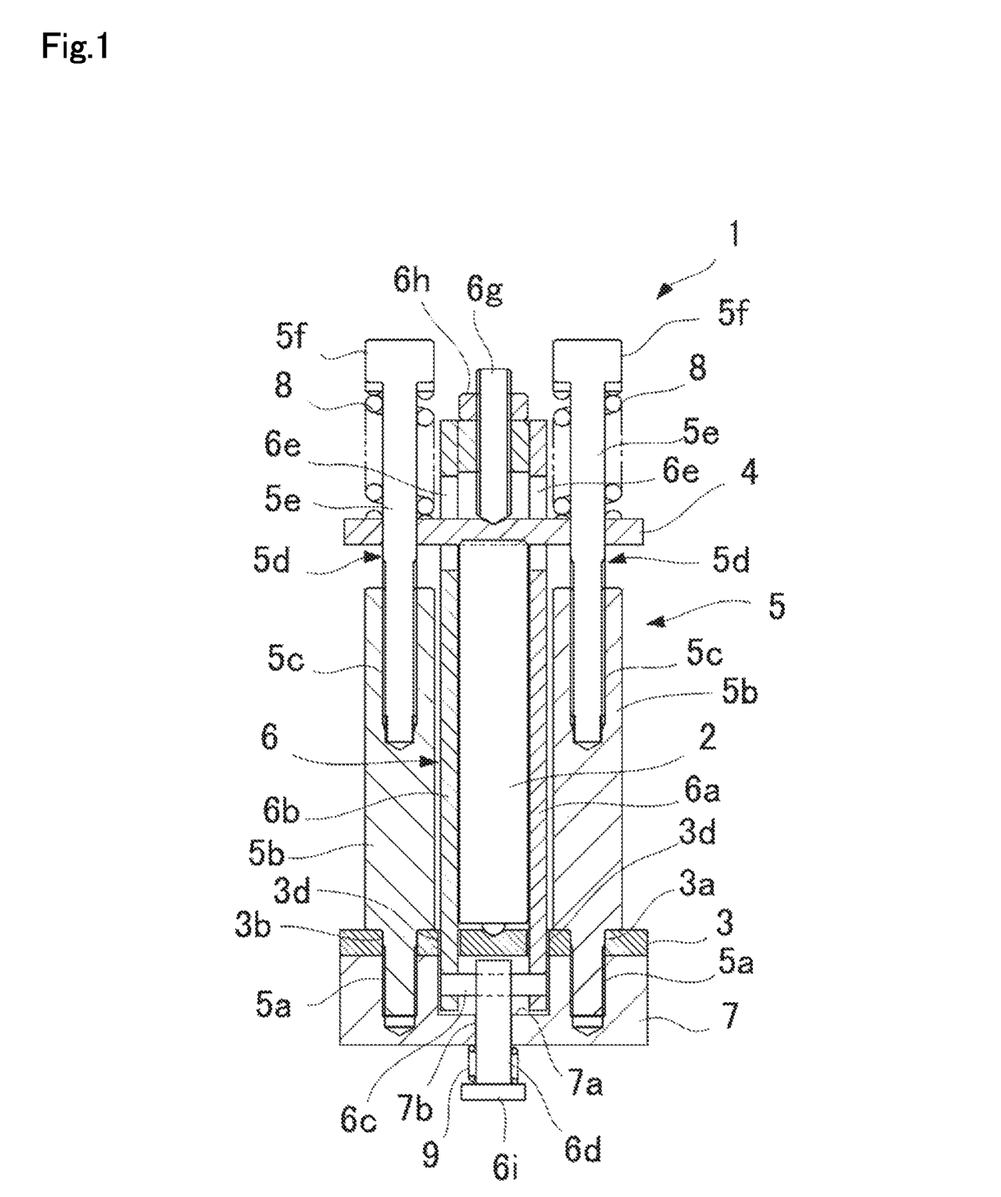
FIG. 1 shows a longitudinal front view that presents an embodiment of the pressure type linear actuator according to the present invention.
Figure 2:
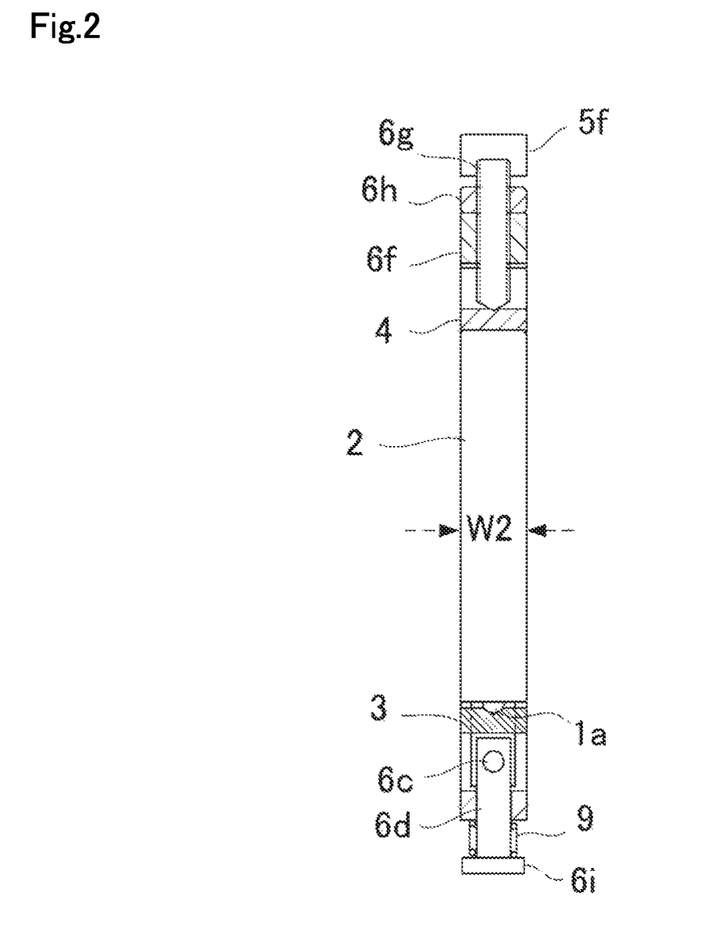
FIG. 2 shows a longitudinal cross-sectional view of the pressure type linear actuator shown in FIG. 1.
Figure 3:
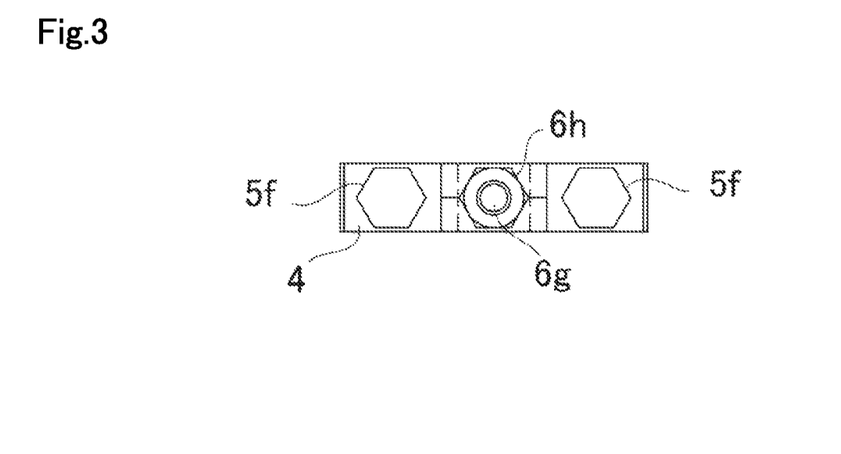
FIG. 3 is a plan view of the pressure type linear actuator shown in FIG. 1.

FIG. 1 is a longitudinal front view that shows one embodiment of a piezoelectric linear actuator according to the present invention. FIG. 2 is a longitudinal cross-sectional side view. FIG. 3 is a plan view.

The piezoelectric linear actuator 1 comprises a laminated piezoelectric actuator 2, a lower support member 3 that supports the aforementioned laminated piezoelectric actuator 2 and extends rightward and leftward of the laminated piezoelectric actuator 2, a pressing member 4 that biases the aforementioned laminated piezoelectric actuator 2 from the top thereof and extends rightward and leftward of the laminated piezoelectric actuator 2, a guide member 5 that is connected to the aforementioned lower support member 3 at both right and left sides of the aforementioned laminated piezoelectric actuator 2 and guides the both right and left sides of the aforementioned pressing member 4, and a displacement transmission member 6 that transfers a piezoelectric effect of the aforementioned laminated piezoelectric actuator 2.

A laminated piezoelectrical element sealed in a metal case which is so-called a metal sealed laminated piezoelectric actuator 2 may be applied in the piezoelectric linear actuator 1. A hemisphere-shaped convex portion 1a (see FIG. 2) is located at the lower part of the metal case of the metal sealed laminated piezoelectrical actuator 2.

The lower support member 3 could be a plate shaped member with the width thereof the same or less than that of a cylindrical shape of the laminated piezoelectrical actuator 2 (outside diameter) W2 and is placed on the base 7. The illustration, FIG. 2 shows that the width of a lower support member 3 is the same as that of the laminated piezoelectric actuator 2, W2. Holes 3a and 3b are formed at the both right and left sides of the lower support member 3, and through these holes of 3a and 3b, the lower support member 3 is fixed to the base 7 by screwing the male screw portion 5a that is formed at the lower part of the guide member 5 into the base 7.

Figure 5:
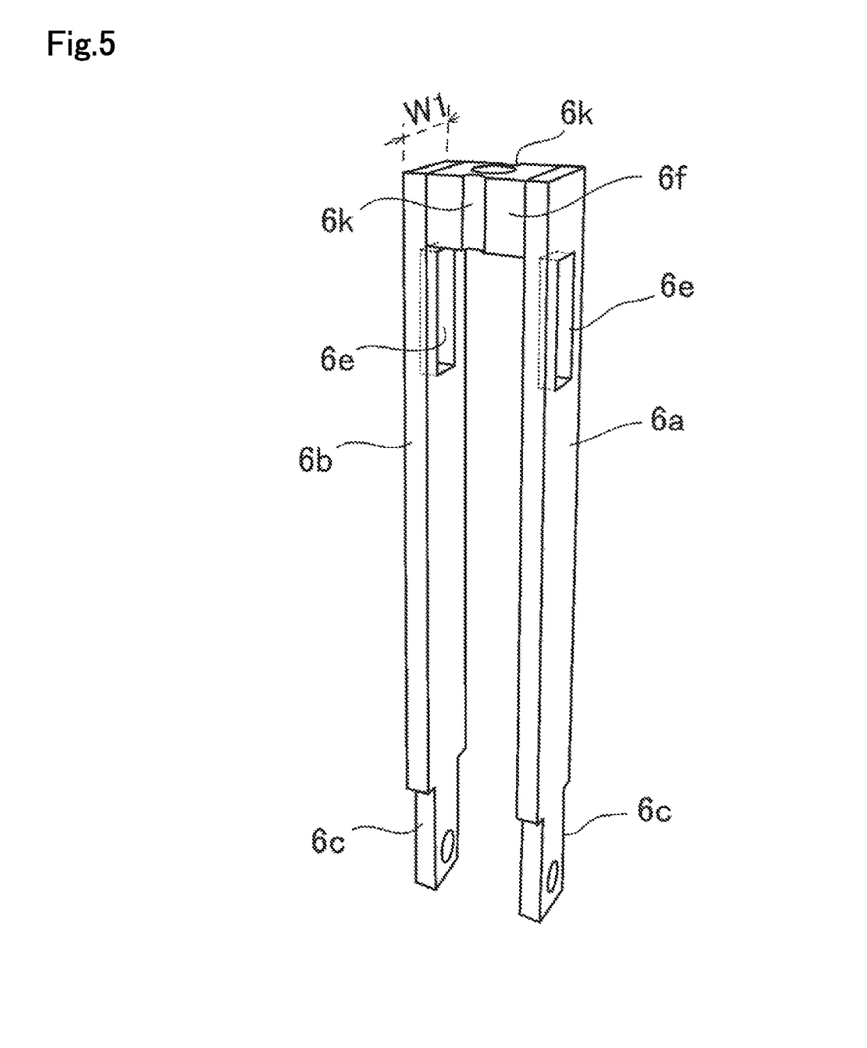
FIG. 5 is a perspective view of the displacement transmission member which is one of the components of FIG. 1.

The displacement transmission member 6 comprises a pair of displacement transmission plates 6a and 6b that extend along the right and left sides of the laminated piezoelectric actuator 2. The maximum width of the displacement transmission plates 6a and 6b, W1 (FIG. 5), is set to be the same or less than that of the laminated piezoelectric actuator 2, W2 (FIG. 2).

The displacement transmission plates 6a and 6b have narrow portions 6c at the bottom thereof and rectangular holes 3d are formed on the lower support member 3 where the narrow portions 6c of the displacement transmission plates 6a and 6b can be inserted. The displacement transmission plates 6a and 6b penetrate the rectangular holes 3d of the lower support member 3 and the displacement transmission plates 6a and 6b intersect the lower support member 3 allowing it to move vertically. In the opposite manner, although it is not shown, the configuration could show that lower support member 3 penetrates the displacement transmission member 6a and 6b.

Bottom parts of the displacement transmission plates 6a and 6b are connected with a connection member 6c, such as a connection pin, and an output section 6d is connected to the connection member 6c. A concave portion 7a is formed on the base 7 to place the connection member 6c and a hole 7b is formed to allow insertion of the output section 6d.

Figure 4:
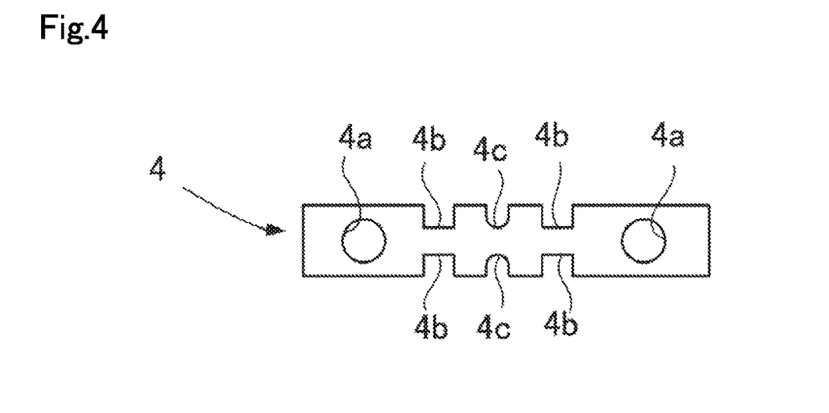
FIG. 4 is a plan view of the pressing member which is one of the components of FIG. 1.

Slits 6e are formed at an upper part of the displacement transmission plates 6a and 6b extending vertically to insert the pressing member 4 to pass through them. The pressing member 4 is a plate shaped member with a width thereof of the same or less than that of the laminated piezoelectric actuator 2 in the same manner as the lower support member 3, and a concave groove 4b is formed to engage with the displacement transmission plates 6a and 6b at the slits 6e and shown in the plan view of FIG. 4, and at the time of assembly, said plate is kept horizontal by rotating it at 90 degrees around the coaxial line in the direction of the length thereof to communicate with the slits 6e and 6e. The concave portion 4c in FIG. 4 is a groove through which to place a lead wire (not shown) to apply a voltage to the laminated piezoelectric actuator 2.

The slits 6e and 6e are formed to a length that allows the displacement transmission plates 6a and 6b to move vertically relative to the pressing member 4. The displacement transmission plates 6a and 6b are connected to the connection portion 6f respectively at the upper part of the pressing member 4. Although it is not shown in the figures, an embodiment could be described such that a hole is formed on the pressing member so that the displacement transmission plates penetrate the pressing member.

An adjustment screw 6g is set in the connection portion 6f of the displacement transmission plates 6a and 6b and is in contact with the pressing member 4. The adjustment screw 6g is provided with a locking nut 6h. Adjusting the screwing degree of the adjustment screw 6g enables adjustment of a relative height of the displacement transmission plates 6a and 6b against the pressing member 4. Furthermore, as in FIG. 5, the concave portion 6k extending vertically in the front and the rear sides of the connection portion 6f is a concave portion through which to put a lead wire (not shown) to apply a voltage to the laminated piezoelectric actuator 2.

The guide member 5 shown in FIG. 1 comprises a column 5b supported with the lower support member 3 and with the base 7 where a male screw portion 5a is screwed in, and a male screw 5d screwed with a female screw 5c formed on the same axial line at the upper part of the column 5b. The shaft portion of the male screw 5d slidably penetrates a hole 4a formed on the both right and left sides of the pressing member 4 and constitutes the guide shaft 5e to vertically guide the pressing member 4.

Figure 6:
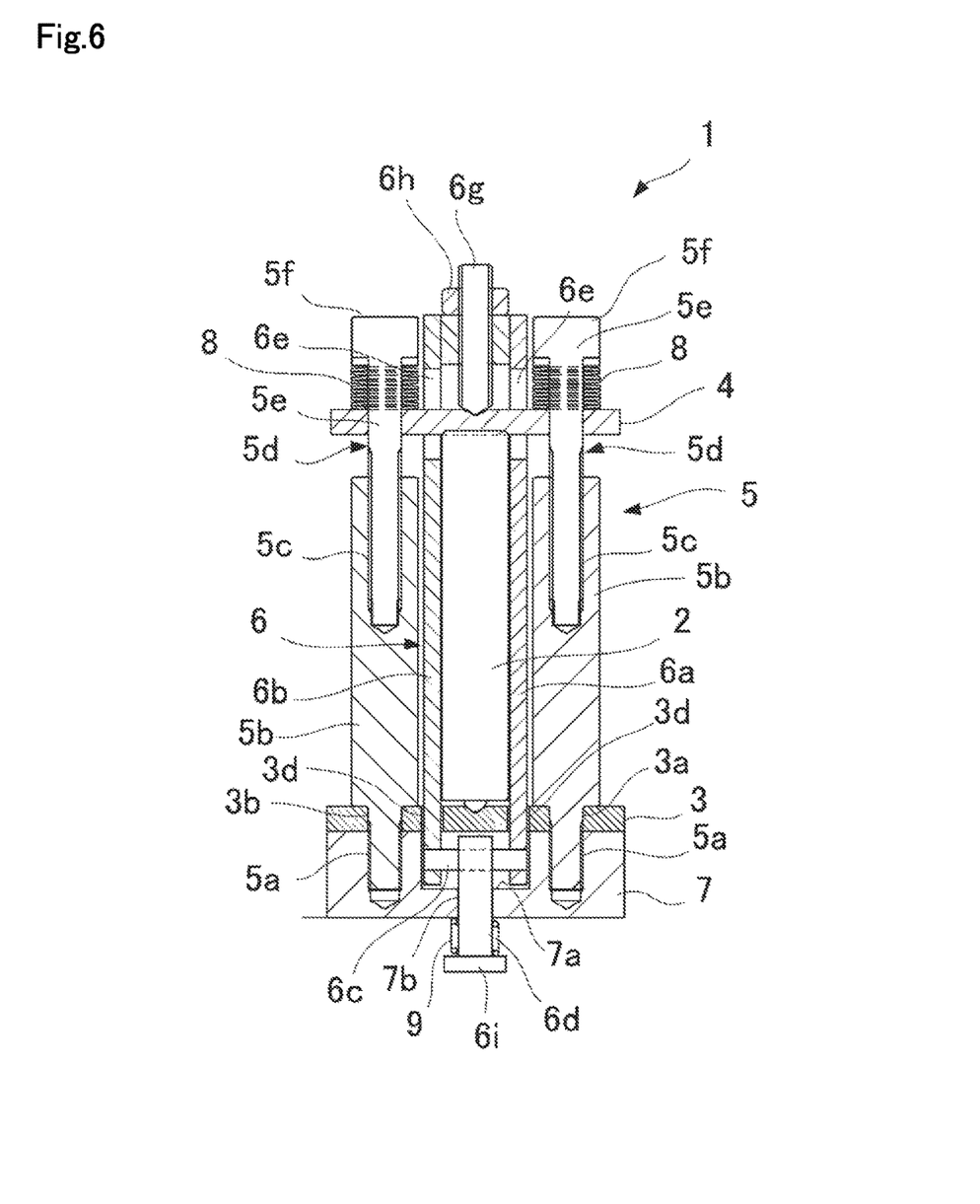
FIG. 6 is a longitudinal front view that shows the modification features of the embodiment of FIG. 1.

An elastic member 8 is interposed between the guide member 5 and the pressing member 4. The pressing member 4 biases the laminated piezoelectric actuator 2. In the example shown in FIG. 1, an outwardly guided coil spring in compressed condition is used as the elastic member 8 on the shaft of the male screw 5d between the head portion 5f of the male screw 5d and the pressing plate 4. A disc spring can be used for the elastic member 8 instead of a coil spring as shown in FIG. 6.

An elastic body 9 is provided to bias the output member 6d downward. The elastic body 9 shown in FIG. 1 is a coil spring fitted around the output member 6d between the flange member 6i provided at the lower end of the output member 6d and the base 7.

In the piezoelectric linear actuator 1 configured as described above, the laminated piezoelectric actuator 2 is extended by applying a voltage to the laminated piezoelectric actuator 2 and pushing up the pressing member 4 against the elastic member 8 and the elastic body 9 and pushing up the displacement transmission member 6 to bias the output portion 6d. By cutting the applied voltage, the pressing member 4 and the displacement transmission member 6 return to an original position and the output portion 6d goes down to an original position.

Reduction in the thickness of the piezoelectric linear actuator is achieved by making each width of the lower support member 3, the pressing member 4, the guide member 5 and the displacement transmission member 6 equal to or less than the width of the laminated piezoelectric actuator so that these members fit within the width of the laminated piezoelectric actuator 2.

Figure 7:
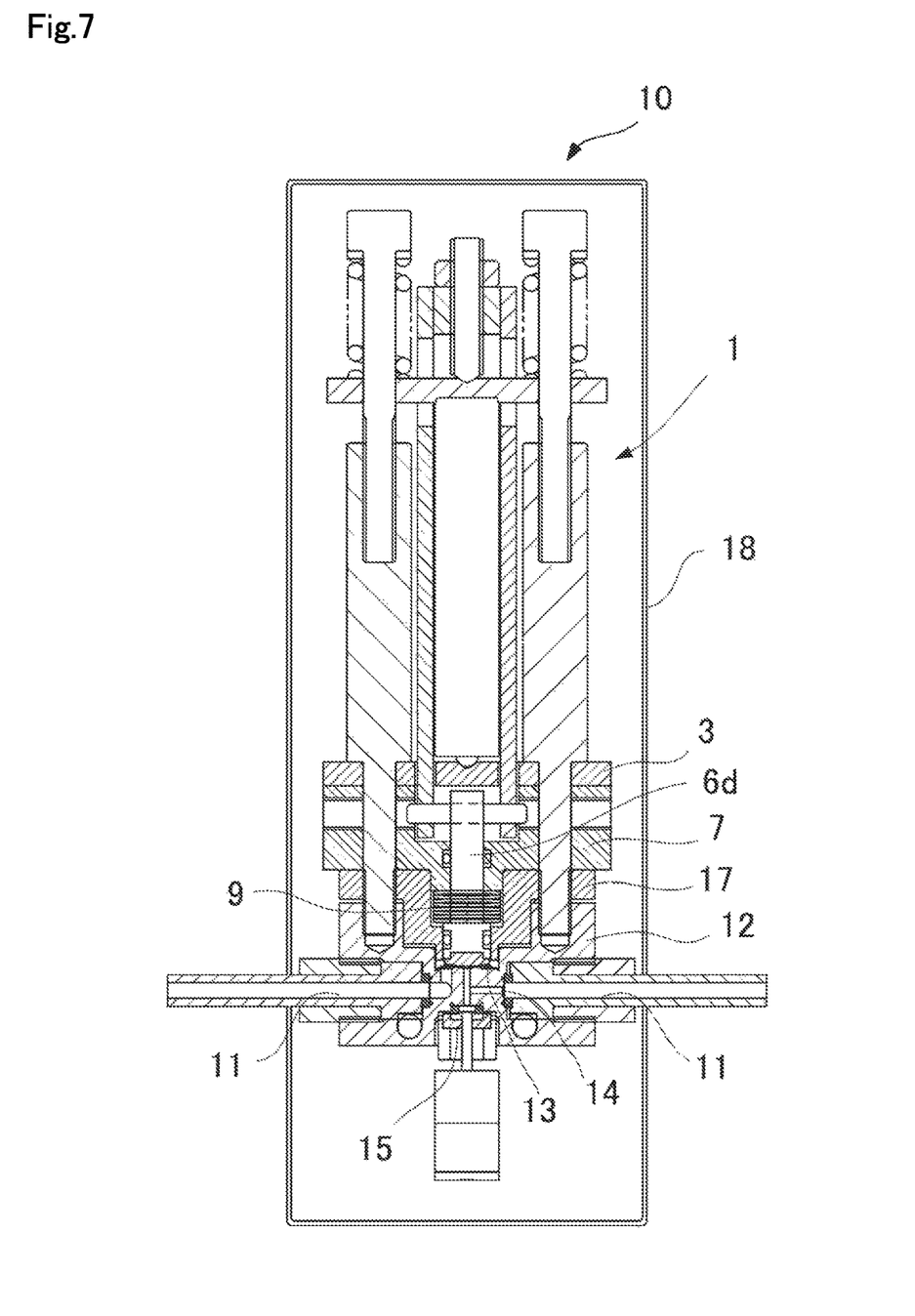
FIG. 7 is a longitudinal front view that shows one embodiment of the flow rate control device according to the present invention.
Figure 8:
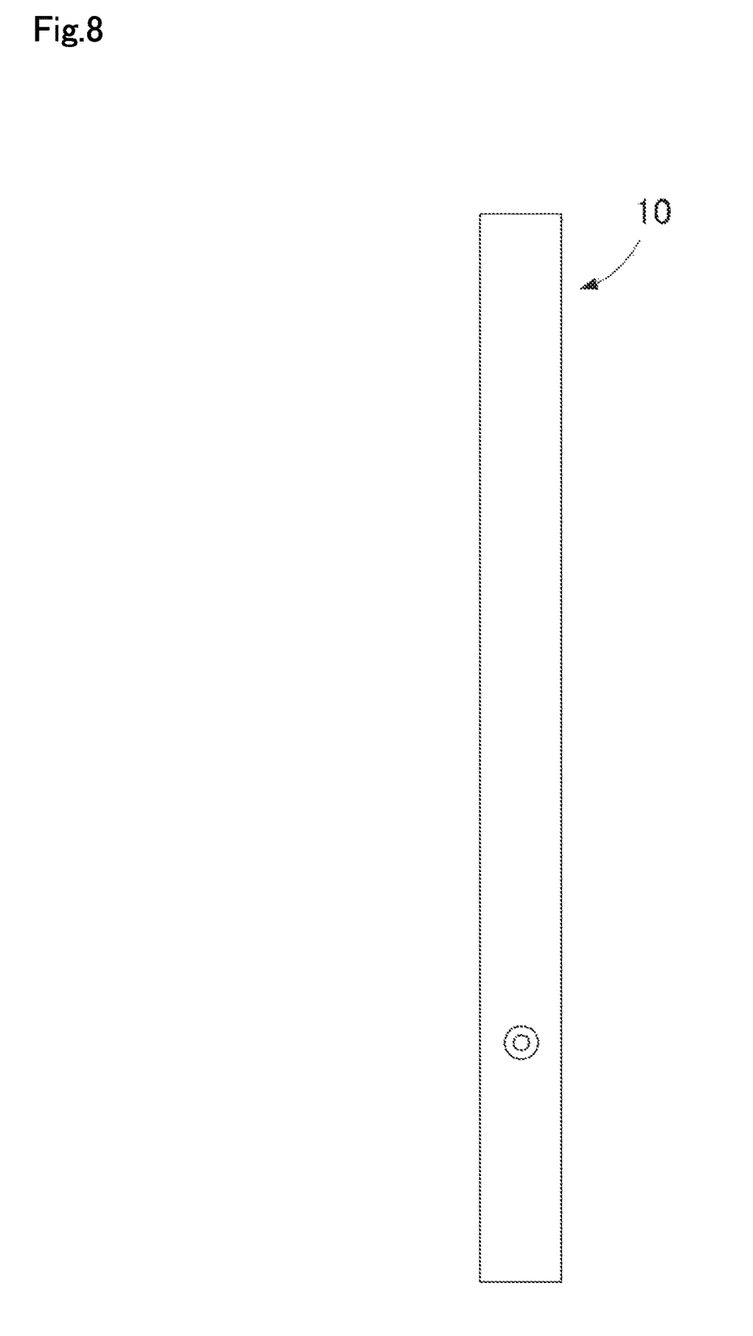
FIG. 8 is a side view of FIG. 7.

FIG. 7 and FIG. 8 show a flow control device comprising a piezoelectric linear actuator 1 as described above. Although the example of FIG. 7 and FIG. 8 is a pressure type flow control device, a detailed explanation is appropriately omitted and denoted the same reference numbers since the basic configuration of a pressure type flow control device is similar to that of a conventional example of FIG. 10.

A pressure type flow control device 10 comprises a piezoelectrically driven valve that includes a valve block 12 wherein a flow path is formed and the piezoelectric linear actuator is attached, a valve provided inside the valve block 12 and output portion 6d of the piezoelectric actuator 1, a valve body 13 that opens and closes the flow path 11 by operating the output portion 6d constituting the valve stem. The pressure type flow control device 10 also comprises an orifice 14 which is interposed in the flow path on the downstream side of the valve body 13, a pressure detector 15 for detecting the pressure in the flow path 11 on the upstream side of the orifice 14, a control device (not shown) to control the opening and closing of the piezoelectrically driven valve based on a detected value of the pressure detector 15. An Elastic body 9 for biasing downward the output unit 6d as a valve stem is shown as accumulated disc springs in the example. Further, in the illustrated example, the valve body 13 is a metal diaphragm valve body and is fixed by being enclosed by the valve body retainer 17.

The pressure type flow control device 10 of the illustrated example has been placed in the thin plate of the casing 18. The base 7, the valve retainer 17, and the valve block 12 are also designed to substantially the same width as the laminated piezoelectric actuator 2, achieving the reduction in overall thickness of the device.

Figure 9:
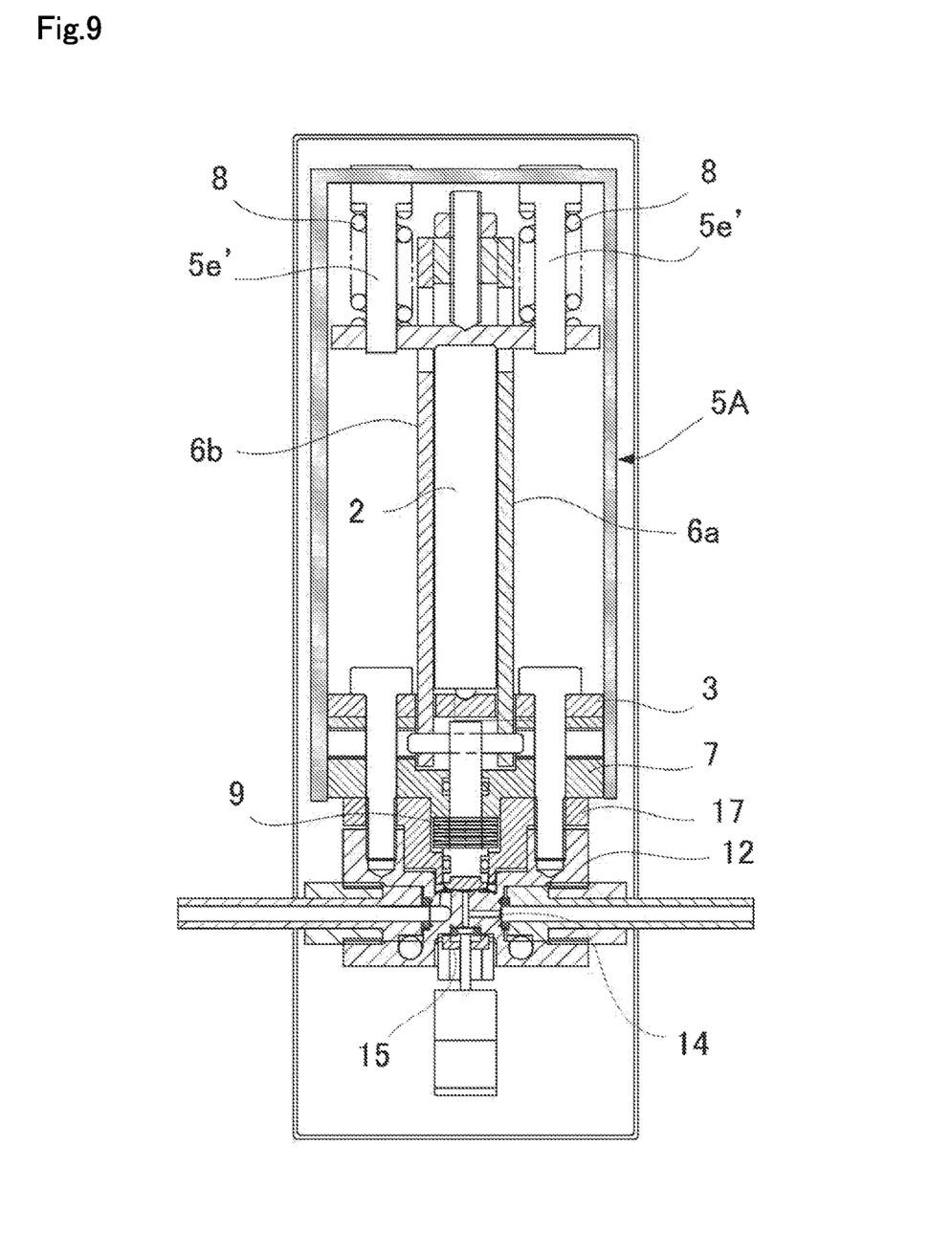
FIG. 9 is a longitudinal front view that shows another embodiment of a flow rate control device according to the present invention.

FIG. 9 shows another embodiment of a flow control device according to the present invention. In the embodiment of FIG. 9, the guide member 5A is different from the embodiment of FIG. 7. That is, in FIG. 9, the guide member 5A is gate shaped, is coupled to the lower support member 3 by the lower end portion thereof being fixed by screws or the like (not shown) on the base 7, and the guide shaft 5e' being attached to an upper portion thereof and being connected downwardly. The other configuration is similar to the embodiment of FIG. 7, and a detailed description thereof will be omitted.

In the above embodiment a pressure type flow control device has been described, other embodiments can also be applied to the flow control device using the laminated piezoelectric actuator of the present invention.

REFERENCE SIGNS LIST

1 Piezoelectric linear actuator
2 Laminated piezoelectric actuator
3 Lower support member
4 Pressing member
5 Guide member
5c Guide shaft
6 Displacement transmission member
6a, 6b Displacement transmission plates
6d Output section
6g Adjustment screw
8 Elastic member
9 Elastic body
10 Flow control device
11 Flow path
12 Valve block
13 Valve body
14 Orifice
15 Pressure detector

The invention claimed is:
1. A piezoelectric linear actuator comprising:
a laminated piezoelectric actuator;
a lower support member that supports the laminated piezoelectric actuator and extends rightward and leftward of the laminated piezoelectric actuator;
a pressing member that biases the laminated piezoelectric actuator from the top thereof and extends rightward and leftward of the laminated piezoelectric actuator;
a guide member connected to the lower support member at right and left sides of the laminated piezoelectric actuator and guides the right and left sides of the pressing member the guide member having a guide shaft that slidably penetrates the right or left side of the pressing member;
a coil spring fitted around the guide shaft for biasing the pressing member toward the laminated piezoelectric actuator; and
a displacement transmission member that transfers a displacement resulting from a piezoelectric effect of the laminated piezoelectric actuator, the displacement transmission member comprising: a pair of displacement transmission plates which extend along the right and left sides of the laminated piezoelectric actuator and are capable of moving vertically to intersect the lower support member and the pressing member and are connected to each other at the lower part of the lower support member and the upper part of the pressing member; an adjustment screw connected to the pair of displacement transmission plates and being capable of adjusting a relative height with respect to the aforementioned pressing member; an output section connected to the pair of displacement transmission plates at a lower part of the lower support member; and an elastic body that biases the output section downward.
2. The piezoelectric linear actuator according to claim 1 wherein the guide member is supported by the lower support member.
3. The piezoelectric linear actuator according to claim 1 wherein the lower support member, the pressing member, the guide member and the displacement transmission member have sizes within a range of a width of the piezoelectric linear actuator.

4. A piezoelectrically driven valve comprising:
a piezoelectric linear actuator according to claim 1;
a valve block to which the piezoelectric linear actuator is attached and wherein a flow path is formed;
a valve shaft formed around the output section of the piezoelectric actuator and formed within the valve block; and
a valve body that opens and closes the flow path by operating the valve shaft.
5. The piezoelectrically driven valve according to claim 4 wherein the valve body consists of a metal diaphragm valve body.
6. The piezoelectrically driven valve according to claim 4 wherein the guide member is supported by the lower support member.
7. The piezoelectrically driven valve according to claim 4, wherein the lower support member, the pressing member, the guide member, the displacement transmission member and the valve block have sizes within a range of a width of the piezoelectric linear actuator.
8. A flow control device comprising:
a piezoelectric linear actuator according to claim 1
a piezoelectrically driven valve which comprises a valve block to which the piezoelectric linear actuator is attached and wherein a flow path is formed, a valve shaft formed around the output section of the piezoelectric actuator and formed within the valve block, and a valve body that opens and closes the flow path by operating the valve shaft; and
a control device for controlling the opening and closing of the piezoelectrically driven valve.
9. The flow control device according to claim 8, wherein the guide member is supported by the lower support member.
10. The flow control device according to claim 8, wherein the guide member is supported by the lower support member.
11. The flow control device according to claim 8, wherein the lower support member, the pressing member, the guide member, the displacement transmission member, and the valve block have sizes within a range of a width of the piezoelectric linear actuator.
12. The flow control device according to claim 8, further comprising an orifice interposed in a downstream flow path of the valve body and a detector that detects the pressure inside a flow path upstream of the orifice, wherein the control device controls the opening and closing of the piezoelectrically driven valve based on a detected value of the pressure detector.
13. A piezoelectric linear actuator comprising:
a laminated piezoelectric actuator;
a lower support member that supports the laminated piezoelectric actuator and extends rightward and leftward of the laminated piezoelectric actuator;
a pressing member that biases the laminated piezoelectric actuator from the top thereof and extends rightward and leftward of the laminated piezoelectric actuator;
a guide member connected to the lower support member at right and left sides of the laminated piezoelectric actuator and guides the right and left sides of the pressing member; the guide member having a guide shaft that slidably penetrates the right or left side of the pressing member;
a disk spring fitted around the guide shaft for biasing the pressing member toward the laminated piezoelectric actuator; and
a displacement transmission member that transfers a displacement resulting from a piezoelectric effect of the laminated piezoelectric actuator, the displacement transmission member comprising: a pair of displacement transmission plates which extend along the right and left sides of the laminated piezoelectric actuator and are capable of moving vertically to intersect the lower support member and the pressing member and are connected to each other at the lower part of the lower support member and the upper part of the pressing member; an adjustment screw connected to the pair of displacement transmission plates and being capable of adjusting a relative height with respect to the aforementioned pressing member; an output section connected to the pair of displacement transmission plates at a lower part of the lower support member; and an elastic body that biases the output section downward.

14. The piezoelectric linear actuator according to claim 13 wherein the guide member is supported by the lower support member.

15. The piezoelectric linear actuator according to claim 13 wherein the lower support member, the pressing member, the guide member and the displacement transmission member have sizes within a range of a width of the piezoelectric linear actuator.

16. A piezoelectrically driven valve comprising:
a piezoelectric linear actuator according to claim 13;
a valve block to which the piezoelectric linear actuator is attached and wherein a flow path is formed;
a valve shaft formed around the output section of the piezoelectric actuator and formed within the valve block; and
a valve body that opens and closes the flow path by operating the valve shaft.

17. The piezoelectrically driven valve according to claim 16, wherein the guide member is supported by the lower support member.

18. The piezoelectrically driven valve according to claim 16 wherein the lower support member, the pressing member, the guide member, the displacement transmission member and the valve block have sizes within a range of a width of the piezoelectric linear actuator.

19. The piezoelectrically driven valve according to claim 16 wherein the valve body consists of a metal diaphragm valve body.

20. A flow control device comprising:
a piezoelectric linear actuator according to claim 13;
a piezoelectrically driven valve which comprises a valve block to which the piezoelectric linear actuator is attached and wherein a flow path is formed, a valve shaft formed around the output section of the piezoelectric actuator and formed within the valve block, and a valve body that opens and closes the flow path by operating the valve shaft; and a control device for controlling the opening and closing of the piezoelectrically driven valve.

21. The flow control device according to claim 20, wherein the lower support member, the pressing member, the guide member, the displacement transmission member, and the valve block have sizes within a range of a width of the piezoelectric linear actuator.

22. The flow control device according to claim 20, further comprising an orifice interposed in a downstream flow path of the valve body and a detector that detects the pressure inside a flow path upstream of the orifice, wherein the control device controls the opening and closing of the piezoelectrically driven valve based on a detected value of the pressure detector.

* * * * *